Jan. 21, 1964 H. S. SOMMERS, JR 3,119,072

RECTIFYING CIRCUITS

Filed Jan. 7, 1960 2 Sheets-Sheet 1

INVENTOR.
Henry S. Sommers, Jr.
BY Eugene M. Whitacre
ATTORNEY

RECTIFYING CIRCUITS

Filed Jan. 7, 1960 2 Sheets-Sheet 2

INVENTOR.
Henry S. Sommers, Jr.
BY Eugene M. Whitacre
ATTORNEY

United States Patent Office 3,119,072

Patented Jan. 21, 1964

3,119,072
RECTIFYING CIRCUITS

Henry S. Sommers, Jr., Princeton, N.J., assignor to Radio Corporation of America, a corporation of Delaware Filed Jan. 7, 1960, Ser. No. 1,019
20 Claims. (Cl. 329—166)

This invention relates to electrical wave rectifying circuits, and more particularly relates to electrical wave rectifying or detecting circuits using voltage controlled negative resistance diodes.

Known types of diode rectifiers used in rectifying or detecting circuits exhibit a relatively low conductance for reverse bias voltages, and a relatively high conductance for forward bias voltages beyond a predetermined threshold, which may, for example, be on the order of 350 millivolts (mv.). The forward bias voltage at which the transition from the low conductance condition to the high conductance condition occurs in known types of diodes varies with changes in temperature. For this reason, such diodes are operated with zero bias when used in rectifying or detecting circuits and, therefore, are not suitable for use in low signal level detector circuits since the detection efficiency is extremely poor unless the amplitude of an applied signal is sufficient to drive the diode well into its high conductance condition.

In accordance with the invention, a voltage controlled negative resistance diode, such as a tunnel diode, is used as the non-linear element of a rectifying or detecting circuit. For reverse bias voltages, a tunnel diode exhibits a high conductance. For forward bias voltages of increasing value, the tunnel diode first exhibits a high conductance which then decreases sharply to first zero conductance condition at a relatively small voltage. As the forward bias voltage is increased still further, the tunnel diode exhibits a negative conductance which first increases and then decreases to a second zero conductance condition. At still higher forward bias voltages the tunnel diode exhibits a positive conductance that increases to a high value in about the same manner and at about the same bias voltage as known types of junction diodes. It has been found that the forward voltage at which the first zero conductance condition occurs is not appreciably affected by temperature. However, the transition voltage range from the second zero conductance condition to the second high conductance condition varies with temperature in about the same manner as known types of diodes.

As used herein the term forward bias voltage indicates that the layer of material with "p" type impurities is biased positively with respect to the layer of material containing "n" type impurities, and the term reverse bias indicates that the layer of material containing "p" type impurities is biased negatively with respect to the layer of material containing "n" type impurities.

For small signal voltage swings, the average conductance of the tunnel diode for excursions in the forward bias direction toward, into or through a portion of the negative conductance region, is much less than for excursions in the reverse direction. Thus the detector circuit including a tunnel diode provides relatively high detection or rectification efficiency for small signals as compared to the relatively low detection efficiency of known types of diode detector circuits for signals of the same low level. Furthermore, a tunnel diode detector subject to temperature variations may be biased for stable operation at a point near the first zero conductance condition to further improve the efficiency of detection for small signals.

The polarity of the direct current (D.-C.) component developed across a load impedance element of a tunnel diode detector circuit is opposite to that developed across the load impedance element of known detector circuits for the same anode-cathode poling of the diodes. This is because the tunnel diode is more conductive for voltage swings in the reverse direction, and conventional diodes are more conductive for voltage swings in the forward bias direction. A low level signal detector in accordance with the invention, provides a signal overload characteristic for signals of sufficient amplitude to drive the tunnel diode into the second high forward conductance region. This effectively limits the D.-C. output level from the detector circuit to a predetermined maximum value which is substantially independent of the input signal strength for higher amplitude signals.

In accordance with a feature of the invention the linearity of detection can be improved by reducing or flattening the negative conductance portion of the tunnel diode characteristic. This may be effected by providing suitable resistance means in parallel with the tunnel diode. If the ohmic value of the resistance means is approximately equal to the absolute value of the minimum negative resistance of the diode, then the resultant conductance of the combination over at least a portion of the negative conductance region is very low. If desired the parallel or shunt resistance means may comprise a physical resistor, or may be built into the diode. For example, in the construction of a tunnel diode by the dot alloy method, to be described, the diode is etched to clean up the surface only to the extent that the leakage current is reduced to the proper value to provide an equivalent shunt resistance of the desired value. Alternatively, the appropriate shunt resistor may be incorporated in the same mount or capsule with the diode.

In accordance with another feature of the invention, the detection efficiency of a tunnel diode detector circuit operating at a fixed frequency may be materially improved by the connection of shunt inductance means across the tunnel diode. The inductance means is selected to resonate with the diode capacitance at the mid-band frequency of the applied signals to tune out the shunting effect of the diode capacitance. When the signal drives the diode in the high conducting (reverse) direction, the conductance of the diode is so high that the reactive component of the tuned circuit comprising inductance means and the diode capacitance is unimportant.

In accordance with a further feature of the invention, resistance means may be added in series with the tunnel diode of a low level detecting circuit. The series resistor modifies the response of the detector circuit to provide a more constant conductance characteristic at large forward and reverse bias voltages, thereby improving the limiting action at higher signal levels. The series resistor can be built into the diode structure either by increasing the base resistance through grading the doping of the tunnel diode dot, or by adding a series resistor inside the diode mount or capsule.

The novel features which are considered to be characteristic of this invention are set forth with particularity in the appended claims. The invention itself, however, both as to its organization and method of operation as well as additional advantages and objects thereof will best be understood from the following description when read in connection with the accompanying drawings, in which:

Figures 1, 2, 3, 4, 5, 6, 7:
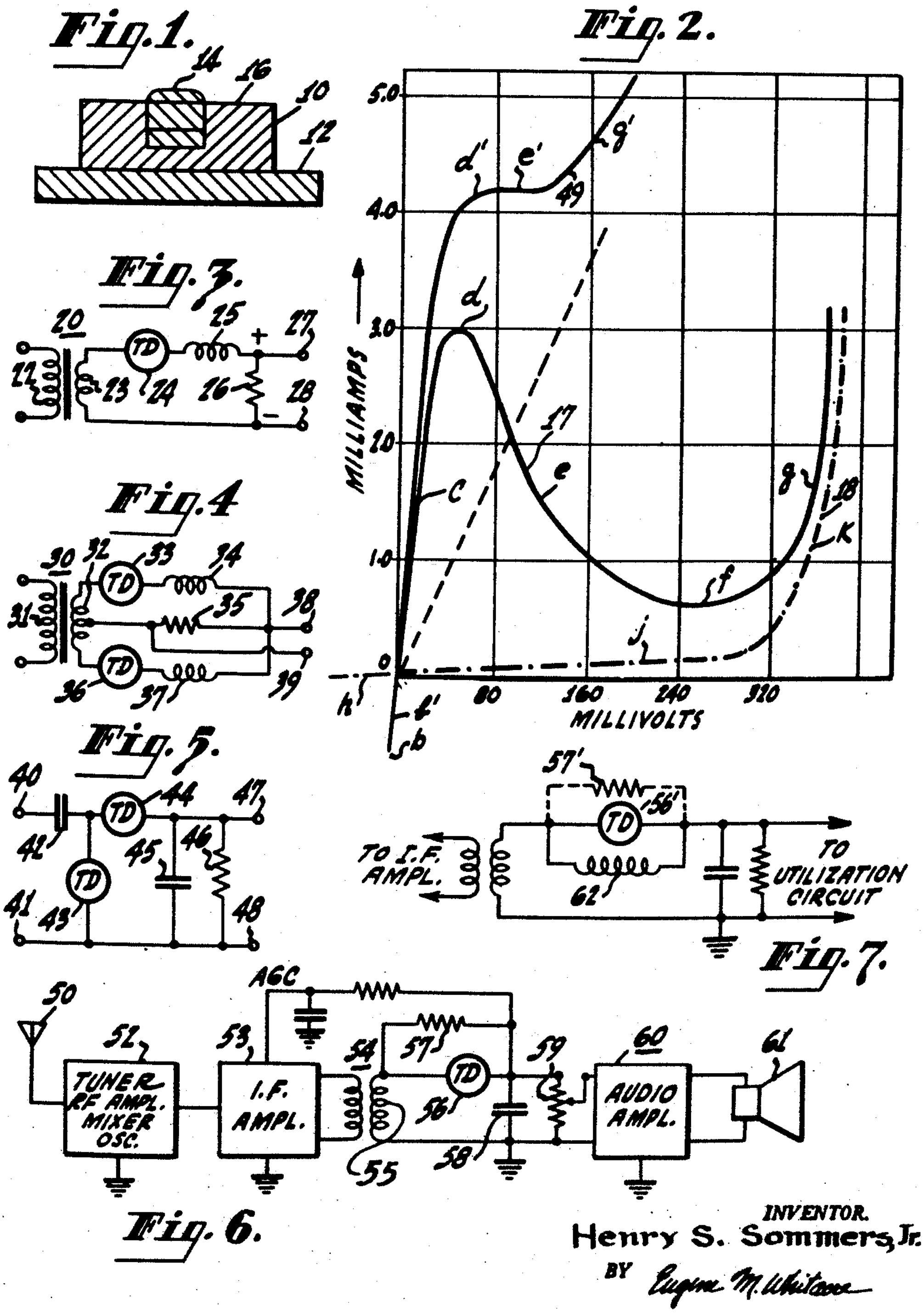
FIGURE 1 is a sectional view of a typical tunnel diode which may be used in detecting or rectifying circuits embodying the invention.
FIGURE 2 is a graph illustrating the voltage-current characteristics of a tunnel diode of the type shown in FIGURE 1, super-imposed on the voltage-current characteristic of a typical junction diode.
FIGURE 3 is a schematic circuit diagram of a half-wave power rectifier circuit including a tunnel diode in accordance with the invention.
FIGURE 4 is a schematic circuit diagram of a full-wave power rectifier circuit in accordance with the invention.
FIGURE 5 is a schematic circuit diagram of a voltage-doubler circuit embodying the invention.
FIGURE 6 is a schematic circuit diagram of a superheterodyne signal receiver including a low level detecting circuit in accordance with the invention.
FIGURE 7 is a schematic circuit diagram of a tuned low level signal detector circuit in accordance with the invention.

Reference is now made to FIGURE 1 which is a diagrammatic sectional view of a typical negative resistance diode that may be used in circuits embodying the invention. By way of example, Leo Esaki, Physical Review, vol. 109, page 603, 1958, has reported a thin or abrupt junction diode exhibiting a negative resistance over a region of low forward bias voltages, i.e., less than 0.3 volt. The diode which is known as a tunnel diode, was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0 \times 10^{19}$ cm.$^{-3}$ by methods known in the semiconductor art. This may be accomplished, for example, by pulling a crystal from molten germanium containing the requisite concentration of arsenic. A wafer 10 is cut from the bar along the 111 plane, i.e. a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A 5 mil diameter dot 14 of 99 percent by weight indium, 0.5 percent by weight zinc and 0.5 weight percent gallium is placed with a small amount of a commercial flux on the free surface 16 of the germanium wafer 10 and then heated to a temperature in the neighborhood of 450° C. for one minute in an atmosphere of dry hydrogen to alloy a portion of the dot to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. The etching step cleans up the surface of the wafer around the dot to reduce leakage current between the wafer and the dot. A suitable slow iodide etch is prepared by mixing one drop of solution comprising 0.55 gram potassium iodide, and 100 cm.$^3$ water in 10 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot using low impedance encapsulation techniques.

Other semiconductors may be used instead of germanium, particularly silicon and the III—V compounds. A III—V compound is a compound composed of an element from group III and an element from group V of the periodic table of Chemical Elements, such as gallium arsenide, indium arsenide and indium antimonide. Where III—V compounds are used, the p and n type impurities ordinarily used in those compounds are also used to form the diode described. Thus, sulfur is a suitable n-type impurity and zinc a suitable p-type impurity which is also suitable for alloying.

The voltage-current characteristic of a typical diode suitable for use with circuits embodying the invention shown by the curve 17 of FIGURE 2. The current scales depend on area and doping of the junction, but representative currents are in the milliampere range.

For a small voltage in the back or reverse direction, the back current of the diode increases as a function of voltage as is indicated by the region *b* of the curve 17. This indicates a high conductance in the reverse direction. For small forward bias voltages, the forward current increases as a function of voltage, (curve 17, region *c*). The forward current results due to quantum mechanical tunneling. At higher forward bias voltages, the forward current due to tnnneling reaches a maximum (region *d*, curve 17), and then begins to decrease. This drop continues (region *e*) until a current minimum is reached (region *f*) and eventually normal injection over the barrier becomes important and the characteristic turns into the usual forward behavior (region *g*). Translated into terms of conductance, the regions *b*, *c* and *g* exhibit high positive conductance, the region *e* exhibits a negative conductance, and the regions *d* and *f* exhibit low conductance.

The voltage-current characteristic of known types of junction diodes is contrasted with that of the tunnel diode in the curve 18 of FIGURE 2. The conventional junction diode exhibits a low conductance over a range of reverse bias voltages as shown in the region *h* out to the breakdown voltage of the diode, not shown. For forward bias voltages the diode exhibits a low conductance, as shown in the region *j*, out to a threshold value, and a high conductance for greater magnitudes of forward bias voltage as shown in region *k*.

The high conductance characteristic in the region *k* of conventional diodes and in region *g* for tunnel diodes is temperature sensitive. In other words, the voltage at which the high conductance characteristics indicated by the regions *g* and *k* of the curves 17 and 18 respectively occurs, varies with temperature. On the other hand, the voltage at which the current maximum (region *d*) of the tunnel diode characteristic occurs has been found to be substantially unaffected by temperature.

A half-wave power rectifier circuit in accordance with the invention is shown in FIGURE 3. The rectifier includes a power transformer 20 having a primary winding 22 and a secondary winding 23. A tunnel diode 24, a filter inductor 25 and a load resistor 26 are connected in series across the secondary winding 23, and any voltage developed across the resistor 26 may be applied to a suitable load circuit, not shown, by way of terminals 27 and 28.

The circuit shown in FIGURE 3 is particularly useful for supplying a low value of direct bias voltage at low impedance such as is required of the bias voltage supply source for certain tunnel diode circuits. In a practical example of the circuit, power voltage such as 115 volts, 60 cycles is applied to the primary winding 22. The turns ratio between the primary winding 22 and secondary winding 23 is such a that a small voltage such as on the order of 2 volts peak-to-peak is developed across the secondary winding 23. Since the average conductance of the tunnel diode 24 for alternating voltage excursions in the forward direction is less than in the reverse direction, a direct voltage component will be developed across the resistor 26 with the terminal 27 being positive with respect to the terminal 28. The inductor 25 serves as a filter to reduce the ripple component of the voltage developed across the load resistor 26.

If desired the half-wave rectifier circuit of FIGURE 3 may be modified to provide full-wave rectification as shown in FIGURE 4. As shown in FIGURE 4, a power transformer 30 having a primary winding 31 and a center tapped secondary winding 32 drops the value of the alternating line voltage applied to the primary winding 31 to a nominal value such as 2 volts peak-to-peak across each half of the secondary winding 32. A tunnel diode 33 and a filter inductor 34 are connected in series with a load resistor 35 across one half of the secondary winding 32, and a tunnel diode 36 and a filter inductor 37 are connected in series with the load resistor 35 across the other half of the secondary winding 32. The circuit across each half of the secondary winding 32 operates in the same manner as the half wave rectifier as described above in connection with FIGURE 3 except that the greater conductivity of the rectifiers 33 and 36 occurs on opposite half cycles of the applied voltage wave. A D.-C. output voltage for application to suitable load may be derived from the output terminals 38 and 39, with the terminal 38 being positive with respect to the terminal 39.

The application of tunnel diodes to voltage doubler circuits is shown in FIGURE 5. An alternating current wave from a suitable source, not shown, is applied between a pair of input terminals 40 and 41. A capacitor 42 and a tunnel diode 43 are connected in series between the input terminals. A tunnel diode 44 and a capacitor 45 are connected across the tunnel diode 43, and a load resistor 46 is connected across the capacitor 45.

Since the tunnel diodes 43 and 44 exhibit a greater average conductance for reverse bias voltages than for forward bias voltages, the portion of the cycle wherein the input terminal 40 is driven negative by the applied alternating current wave produces a greater current flow through the diode 43 than through the diode 44. This causes the capacitor 42 to change so that the plate thereof connected to the diodes is more positive than the plate connected to the terminal 40. On the succeeding half cycle wherein the terminal 40 is positive with respect to the terminal 41, the average conductance of the diode 44 is greater than that of the diode 43. The positive going portion of the wave applied to the terminal 40 adds to the charge on the capacitor 42 to cause increased current through the diode 44, causing a greater direct voltage to be developed across the capacitor 45 than would be developed by half wave or full wave rectification. The D.-C. voltage which appears across the load resistor 46 may be applied from the output terminals 47 and 48 to a suitable load circuit, not shown.

The circuits shown in FIGURES 3, 4 and 5 incorporating tunnel diodes, exhibit a higher rectification efficiency for very low applied voltages than is achieved with conventional diodes for low values of applied voltages. Since the tunnel diode may be made to present a very low intrinsic resistance, this permits the design of rectifier circuit in accordance with the invention to provide relatively low D.-C. voltages at low impedance levels.

FIGURE 6 is a schematic circuit diagram partly in block form of a superheterodyne signal receiver. Radio frequency wave energy intercepted by the antenna 50 is applied to the input circuits 52 of the receiver which include the signal selection or tuner circuits, radio frequency amplifying circuits, mixer circuits, and oscillator circuits all of which are well known in the art. The received radio frequency wave is heterodyned to a corresponding signal modulated wave of intermediate frequency (I.F.) by the circuits 52 and applied to an I.F. amplifier 53 for further fixed frequency amplification. The I.F. amplifier 53 output circuit includes an output transformer 54 which drives a low level detector circuit embodying the invention. The I.F. transformer 54 includes a secondary winding 55 across which is connected the parallel combination of a tunnel diode 56 and a resistor 57 in series with the parallel combination of a capacitor 58 and a resistor 59 having an adjustable tap. Audio frequency waves developed across the output resistor 59 are applied to an audio amplifier 60 which drives a loudspeaker 61.

The resistor 57 connected in parallel with the tunnel diode 56 modifies the tunnel diode characteristic to improve the linearity of detection thereof. Although the resistor 57 is shown as a physical resistor in the schematic circuit diagram of FIGURE 6 it is to be understood that this resistor may represent the equivalent resistance across the junction of the tunned diode which could be produced, for example by controlling the slow iodide etch step so that sufficient leakage current remains to produce the equivalent of the resistor 57.

The curve 49 of FIGURE 2 shows the voltage-current characteristic of a tunnel diode having a shunt resistance that is slightly less than the absolute value of the minimum negative resistance that the diode would exhibit in the absence of the shunt resistance. It will be noted by comparison of the curves 17 and 49 that the major alteration of the diode voltage-current characteristic by the parallel resistor 57 is that the negative slope, region *e* of of the curve 17, is flattened, and the negative resistance effect of the diode 56 is eliminated or is slightly positive. The region *e'* of the curve 49 shown in FIGURE 2 thus exhibits a substantially constant low conductance. The region *b'* of the curve 49 is similar to the region *b* of the curve 17, and exhibits about the same high conductance characteristic, as illustrated in the drawing.

Intermediate frequency signals of extremely small magnitude that are applied to the tunnel diode 56 are bypassed around the load resistor 59 through the capacitor 58. Signals applied to the diode 56 are detected by virtue of the fact that the tunnel diode exhibits a lower conductance for signal swings in the forward bias direction than for signal swings in the reverse bias direction. The detected signals are developed across the resistor 59 and applied to the audio amplifier 60. For small signals the detection efficiency of circuits using a zero biased tunnel diode is much greater than that of circuits using known types of junction diodes. Detection efficiency may be regarded as the ratio of the audio power output to the I.F. power input. The magnitude of the D.C. voltage component developed across the resistor 59 is roughly proportional to the extent that the applied signal drives the zero biased tunnel diode in the forward direction past the knee of the curve 49 (region *d'*) whereas in a conventional diode no appreciable direct voltage is produced until the applied signal voltage is of sufficient magnitude to drive the diode significantly into the region *g'*. In other words, to achieve the same detection efficiency, the amplitude of the signal voltage applied to conventional diode detector circuits must be several times as great as that applied to the tunnel diode detector circuits. Accordingly the amount of amplification ahead of the second detector is materially reduced for receivers using tunnel diode detectors. Low level tunnel diode detector circuits wherein the tunnel diode is not parallel by resistance means may be used if desired, at a sacrifice in the linearity of detection.

Another aspect of the operation of tunnel diode detector circuits is that for signals above a certain level, the D.C. output voltage is substantially independent of the applied high frequency voltage. This limiting action occurs when the applied signal level becomes large enough to drive the diode into the second forward bias high conductance region *g* or *g'* of the curves 17 and 49 respectively. In this regard, the tunnel diode provides a high conductance for the peaks of large amplitude input signals or both positive and negative half cycles, and accordingly no further change in D.C. output voltage will occur, except the small change caused by the differences in the forward and reverse high conductance characteristics (regions *b'* and *g'*).

For detection at a fixed frequency a low level detector circuit of the type shown in the schematic circuit diagram of FIGURE 7 may be used. The circuit of FIGURE 7 is substantially the same as that shown in FIGURE 6 with the addition of an inductor 62 which is connected in parallel with the tunnel diode 56'. For high frequency signals the capacitive reactance of the tunnel diode may become quite low, and effectively bypass the signals around the diode. The inductor 62 is selected to resonate with the tunnel diode interelectrode capacitance at the midband frequency of the signals applied thereto. The resultant parallel resonant circuit provides a high series impedance to the applied signals, and neutralizes the shunting effect of the tunnel diode capacitance. When the tunnel diode 56' is driven in the reverse bias direction by the applied signals, the conductance thereof is so high that the high impedance of the tuned circuit can be neglected. When the diode 56' is driven in the forward direction by the applied signals, the average conductance of the diode and tuned circuit may be maintained at a relatively low value.

Figures 8, 9, 10, 11, 12:
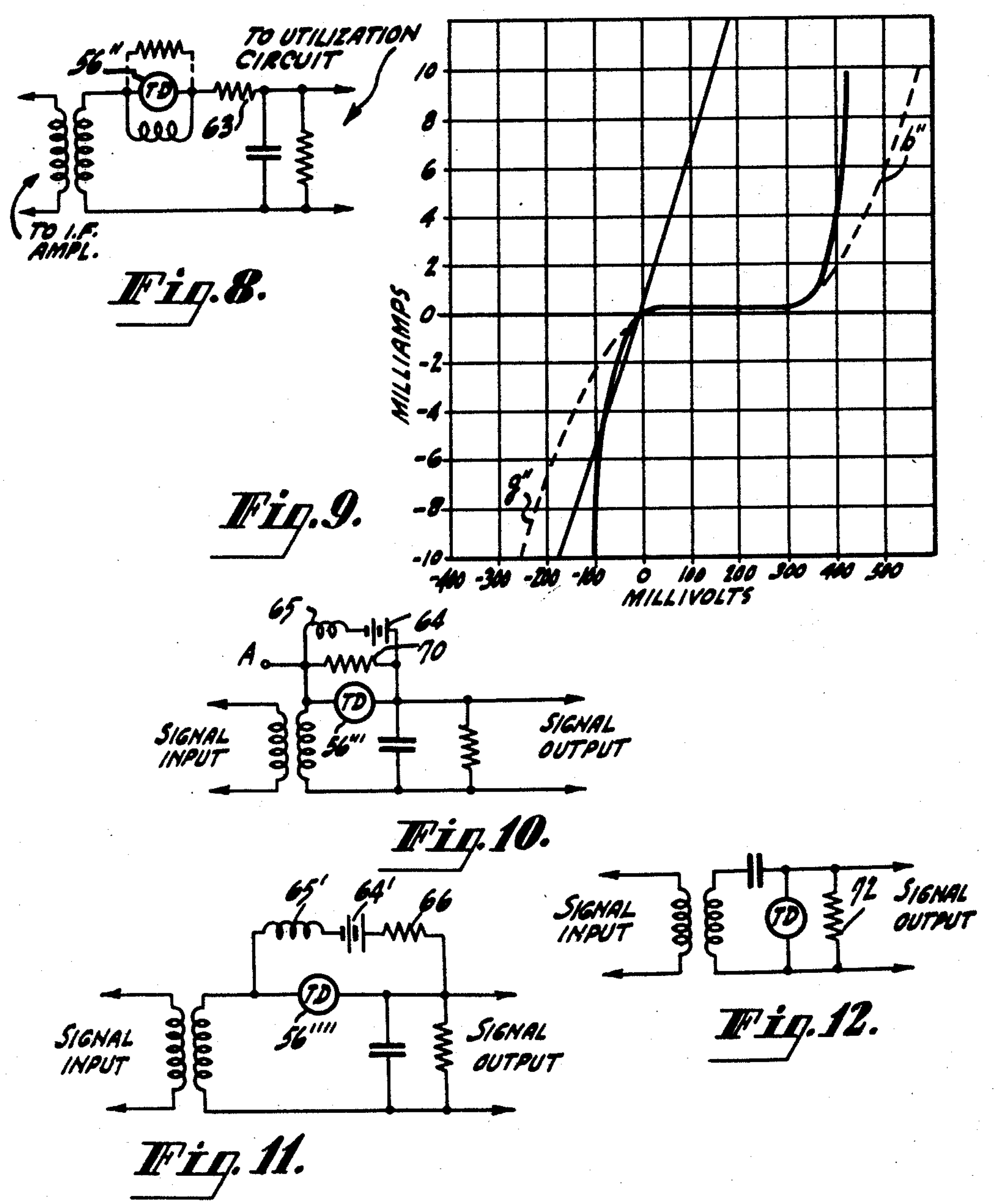
FIGURE 8 is a schematic circuit diagram of a modification of the tuned low signal detector shown in FIGURE 7.
FIGURE 9 is a graph of a tunnel diode voltage-current characterisitc as modified by a series connected resistor.
FIGURE 10 is a schematic circuit diagram of a modification of a low level signal detector in accordance with the invention.
FIGURE 11 is a schematic circuit diagram of another embodiment tunnel diode detector in accordance with the invention.
FIGURE 12 is a schematic circuit diagram of still another embodiment of a tunnel diode detector in accordance with the invention.

FIGURE 8 is a schematic circuit diagram of a low level detector circuit similar to that shown in FIGURE 7 with the exception that a resistor 63 has been added in series with the tunnel diode 56''. The resistor 63 provides the detector circuit with a flatter overload detection characteristic for larger forward and reverse bias voltages. The effect of the series resistor 63 on the conductance characteristic of the tunnel diode 56'' is shown in a graph of FIGURE 9. It will be noted that the resistor 63 tends to reduce the slope of the regions $g''$ and $b''$ and make them parallel. This modifies the overload or limiting characteristic of the detector circuit so that higher levels of applied signals may be accommodated without overloading the following stages. The series resistor 63 can be built into the diode structure either by increasing the base resistance through grading the doping or by adding a series resistor inside the mount.

FIGURE 10 is a schematic circuit diagram of a low level detector similar to that shown in FIGURE 6 with the exception that a D.C. biasing voltage is applied to the diode 56''' with a suitable battery 64 and an R.F. choke 65. The battery is preferably selected to bias the diode close to the knee of the curve 49 (region $d'$), to further improve the efficiency of low level signal detection and still further reduce the lower limit for linear detection. The application of bias to a tunnel diode detector is practical since the voltage at which the knee of the curve 49 (region $d'$) occurs is substantially unaffected by temperature.

A resistor 70 is connected in parallel with the tunnel diode 56''' across which is developed the necessary diode biasing voltage. The resistance value of the resistor 70 is selected to provide the desired voltage-current characteristic of the diode, such as the characteristic represented by the curve 49 of FIGURE 2. If the bias voltage supplied to the diode is in the range corresponding to the region $e$ of the curve 17, then the ohmic value of the resistor 70 must be less than the absolute value of the maximum negative resistance of the diode to prevent switching.

If desired, the resistor 70, which may comprise a physical resistor, or the equivalent leakage resistance across the junction of the diode, may be omitted, and biasing voltage for the diode may be applied directly from a low resistance voltage source, which is shown as an R.F. choke coil 65' and a battery 64' in FIGURE 11. A small resistor 66 with resistance less than the absolute value of the negative resistance of the diode may be added to prevent surging of the choke coil 65'. When biased to the region $d$ of the curve 17 of FIGURE 2, the circuit of FIGURE 11 provides full wave rectification of the applied signal wave. This may be understood by observing that both half cycles of the applied signal wave cause a reduction in current through the tunnel diode.

As shown in FIGURE 12, the tunnel diode detector circuit may be simplified by deriving the detected signal from a resistor 72 connected across the terminals of the diode. This circuit not only has the advantage of eliminating the additional load resistor, but also eliminates the loss in power dissipated by the shunt resistor.

What is claimed is:

1. An electrical circuit comprising in combination: a tunnel diode having a high conductance in response to reverse bias voltages, a high conductance in response to relatively small values of forward voltages, lower values of conductance in response to intermediate values of forward bias voltages, and a relatively high conductance in response to larger values of forward bias voltages, whereby the average conductance in the reverse bias direction is greater than the average conductance in the forward bias direction; means for applying an alternating current wave to said tunnel diode; and means providing a load impedance element connected to said tunnel diode for developing a direct voltage component thereacross of a polarity which tends to bias said diode in the forward bias voltage direction.

2. A detector circuit comprising in combination: a tunnel diode having a first high conductance condition in response to reverse bias voltages, a second high conductance condition in response to relatively small values of forward voltages, lower conductance condition in response to intermediate values of forward bias voltages and a third high conductance condition in response to larger values of forward bias voltages, the transition voltages between said second high conductance condition and said lower conductance condition being substantially insensitive to temperature relative to the transition voltages between said lower conductance condition and said third high conductance condition; means for applying a signal modulated alternating current wave to said tunnel diode whereby said tunnel diode provides a greater conductivity when said wave biases said tunnel diode in the reverse direction than when said wave biases said tunnel diode in the forward direction; and means connecting a load impedance element to said tunnel diode for developing thereacross the signal modulation components of said signal modulated alternating current wave.

3. A rectifying circuit comprising the combination of an input transformer having a secondary winding for providing a relatively low value of alternating voltage wave, a pair of output terminals, a tunnel diode and a filter inductor connected in series between one end of said secondary winding and one of said output terminals, the other of said output terminals being connected with the other end of said secondary winding, and means providing a load impedance element connected between said output terminals for developing a direct voltage component tending to bias said tunnel diode in the forward direction.

4. A full wave rectifier comprising the combination of an input transformer having a primary winding for connection with an alternating current power source and a center tapped secondary winding, a first and second output terminals, a first tunnel diode and a first filter inductor connected in series between one end of said secondary winding and said first output terminal, a second tunnel diode and a second filter inductor connected in series between the other end of said secondary winding and said first output terminal, the electrode of said second tunnel diode that is connected to said other end of said secondary winding being the same as the electrode of said first tunnel diode that is connected to said one end of said secondary winding, said second output terminal being connected to the center tap of said secondary winding and means providing a direct current conductive load impedance element connected between said first and second output terminals whereby a direct voltage is developed across said load impedance element in response to alternating current power applied to said primary winding which tends to bias said first and second tunnel diodes in the forward direction.

5. A low level detector circuit comprising in combination means providing a source of high frequency wave energy; a semiconductor junction tunneling device having direct current conductive resistance means connected across said semiconductor junction, said tunneling device and said resistance means exhibiting a first high conductance condition in response to reverse bias voltages, a second high conductance condition in response to relatively small values of forward bias voltages, low conductance condition in response to intermediate values of forward bias voltage and a third high conductance condition in response to larger values of forward bias voltages; means coupling said high frequency wave energy source to said tunneling device; and output circuit means connected to said tunneling device to derive a direct voltage component that varies in amplitude in accordance with the voltage amplitude of said high frequency wave energy for voltage amplitudes of said high frequency wave energy sufficient to drive said tunneling device into said low conductance condition but not into said third high conductance condition.

6. A low level detector circuit as defined in claim 5 wherein said resistance means comprises a physical resistor.

7. A low level detector circuit as defined in claim 5 wherein said resistance means comprises the leakage resistance between the electrodes of said tunneling device.

8. A low level detector circuit as defined in claim 5 wherein said output circuit means includes a load resistor connected in series with said tunneling device.

9. A low level detector as defined in claim 5 including an inductor connected in parallel with said tunneling device to resonate with the capacitance of said diode at said high frequency.

10. A low level detector as defined in claim 5 including a resistor in series with said tunneling device to improve the linearity of detection.

11. A low level detector as defined in claim 5 including means for biasing said tunneling device for operation substantially at the transition between said second high conductance condition and said low conductance condition.

12. A low level detector circuit comprising in combination means providing a source of wave energy, a tunnel diode exhibiting a first high conductance in response to reverse bias voltages, a second high conductance condition in response to relatively low values of forward bias voltages, and a third high conductance condition in response to larger values of forward bias voltages, said tunnel diode exhibiting a greater average conductance for reverse bias voltages than for forward bias voltages; means for applying said wave energy to said tunnel diode; and a load impedance element connected to said tunnel diode to derive direct voltage components that vary in amplitude in accordance with the voltage amplitude of said wave energy for voltage amplitudes of wave energy less than said larger values of forward bias voltage.

13. A low level detector circuit comprising in combination means providing a source of wave energy, a tunnel diode exhibiting a first high conductance condition in response to reverse bias voltages, a second high conductance condition in response to a range of relatively small forward bias voltages, an intermediate negative conductance condition in response to a range of intermediate values of forward bias voltage and a third high conductance in response to larger values of forward bias voltages, resistance means direct current conductively in parallel with said tunnel diode approximately equal in positive conductance value to the minimum value of said negative conductance condition of said diode whereby the combination of said diode and said resistance means present a relatively low conductance over at least a portion of said range of intermediate values of bias voltage whereby the average conductance of said diode in the reverse bias direction is greater than the average conductance thereof in the forward bias direction, means for applying said wave to said tunnel diode, and means including a load impedance element connected to said tunnel diode for providing a direct-current circuit for said diode whereby an output voltage having a direct voltage component is of a polarity tending to bias said tunnel diode in the forward direction is developed across said impedance element.

14. A low level detector circuit comprising in combination means providing an input circuit for high frequency wave energy, a tunnel diode characterized by a high conductance in response to reverse bias voltages, a relatively low average conductance region followed by a relatively high conductance region in response to increasing values of forward bias voltage, means for coupling said input circuit to said tunnel diode, and means providing a load impedance element connected to said tunnel diode whereby high frequency wave energy is rectified to produce a direct component of voltage across said impedance element.

15. A full-wave rectifying circuit comprising in combination a tunnel diode having in the forward voltage direction a current-voltage characteristic which includes first and second positive conductance regions separated by a negative conductance region and which exhibits a current peak at the junction of said first positive and said negative conductance regions, means for forward biasing said diode to operate at said current peak, means for applying alternating current waves to said diode, and means providing a load impedance coupled to said diode for developing a direct voltage thereacross in response to the full-wave rectification of said alternating waves.

16. A signal translating circuit comprising: input circuit means including a first pair of terminals for connection to a source of input signals; output circuit means including a second pair of terminals for connection to a utilization circuit; means for connecting one of said pair of input terminals and one of said pair of output terminals in common; and a tunnel device connected between the other terminal of each of said pairs of input and output terminals; said tunnel device having a high conductance in response to reverse bias voltages, a high conductance in response to relatively small values of forward voltages, lower values of conductance in response to intermediate values of forward bias voltages, and a relatively high conductance in response to larger values of forward bias voltages, whereby the average conductance in the reverse bias direction is greater than the average conductance in the forward bias direction; said utilization circuit providing a load impedance to said tunnel device for developing a direct voltage component thereacross of a polarity which tends to bias said diode in the forward bias voltage direction.

17. A signal translating circuit comprising: input circuit means including a first pair of terminals for connection to a source of input signals; output circuit means including a second pair of terminals for connection to a uitlization circuit; means for connecting one of said pair of input terminals and one of said pair of output terminals in common; a semiconductor junction tunneling device connected between the other terminal of each of said pairs of input and output terminals, and direct current conductive resistance means across said semiconductor junction, said tunneling device and said direct current conductive resistance means exhibiting a first high conductance condition in response to reverse bias voltages; a second high conductance condition in response to relatively small values of forward bias voltages; a low conductance condition in response to intermediate values of forward bias voltages; and a third high conductance condition in response to larger values of forward bias voltages.

18. A signal translating circuit as defined in claim 17 wherein said resistance means comprises a physical resistor.

19. A signal translating circuit as defined in claim 17 wherein said resistance means comprises leakage resistance across the junction of said tunnel diode.

20. An electrical circuit comprising in combination: a semiconductor junction tunneling device having a high conductance in response to reverse bias voltages, a high conductance in response to relatively small values of forward voltages, lower values of conductance in response to intermediate values of forward bias voltages, and a relatively high conductance in response to larger values of forward bias voltages, whereby the average conductance in the reverse bias direction is greater than the average conductance in the forward bias direction; means for applying an alternating current wave to said tunneling device, said tunneling device being biased to its D.-C. operating point solely by said alternating current wave, and means providing a load impedance element connected to said tunneling device for developing a direct voltage component thereacross of a polarity which tends to bias said diode in the forward bias voltage direction.

References Cited in the file of this patent

UNITED STATES PATENTS

| | | |
|---|---|---|
| 1,813,922 | Hansell | July 14, 1931 |
| 2,227,906 | Kellogg | Jan. 7, 1941 |
| 2,679,584 | MacDonald | May 28, 1954 |
| 2,771,552 | Lynch | Nov. 20, 1956 |
| 2,912,584 | De Mong | Nov. 10, 1959 |
| 2,931,966 | Rockey | Apr. 5, 1960 |
| 2,975,354 | Rosen | Mar. 14, 1961 |
| 2,983,854 | Pearson | May 9, 1961 |
| 3,056,073 | Mead | Sept. 25, 1962 |

FOREIGN PATENTS

| | | |
|---|---|---|
| 158,879 | Australia | Sept. 16, 1954 |

OTHER REFERENCES

I.R.E. Wescon Convention Record, August 18, 1959, Part 3, pages 9 to 31, "Electron Devices."

"Tunnel Diode-New Electronic Work Horse," Electronic Industries, August 1959, pages 182–187.